United States Patent
Mori et al.

(10) Patent No.: US 11,456,572 B2
(45) Date of Patent: Sep. 27, 2022

(54) LIGHT SOURCE MEASUREMENT APPARATUS

(71) Applicant: Panasonic Intellectual Property Management Co., Ltd., Osaka (JP)

(72) Inventors: Shigeyuki Mori, Osaka (JP); Koji Funami, Kyoto (JP); Masahiro Mori, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 370 days.

(21) Appl. No.: 16/712,841

(22) Filed: Dec. 12, 2019

(65) Prior Publication Data

US 2020/0212647 A1 Jul. 2, 2020

(30) Foreign Application Priority Data

Dec. 26, 2018 (JP) .............................. JP2018-242267

(51) Int. Cl.
| | |
|---|---|
| *G01C 1/00* | (2006.01) |
| *H01S 5/00* | (2006.01) |
| *G01B 11/27* | (2006.01) |
| *G02B 19/00* | (2006.01) |

(52) U.S. Cl.
CPC ............ *H01S 5/0014* (2013.01); *G01B 11/27* (2013.01); *G02B 19/0057* (2013.01)

(58) Field of Classification Search
None
See application file for complete search history.

(56) References Cited

U.S. PATENT DOCUMENTS

| | | | |
|---|---|---|---|
| 5,700,084 A | 12/1997 | Yasukawa et al. | |
| 6,219,146 B1 * | 4/2001 | Innes ................. | G01B 11/26 356/508 |
| 7,023,551 B2 | 4/2006 | Iizuka et al. | |
| 8,559,088 B2 | 10/2013 | Kimura | |
| 8,599,369 B2 | 12/2013 | Urano et al. | |

FOREIGN PATENT DOCUMENTS

| | | | | |
|---|---|---|---|---|
| CN | 1890558 A | * | 1/2007 | ............ G01N 21/21 |
| JP | 3-264837 | | 11/1991 | |
| JP | 4-74934 | | 3/1992 | |
| JP | 2002-043673 | | 2/2002 | |
| JP | 3594706 B | | 12/2004 | |
| JP | 2011-002314 | | 1/2011 | |
| JP | 2012-108478 | | 6/2012 | |
| JP | 2016-125920 | | 7/2016 | |

* cited by examiner

*Primary Examiner* — Mark Hellner
(74) *Attorney, Agent, or Firm* — Wenderoth, Lind & Ponack, L.L.P.

(57) ABSTRACT

A light source measurement apparatus includes an objective lens that collects light emitted from a light source having a plurality of light emission points, a first reflection attenuation filter, a second reflection attenuation filter, a condensing lens, a space filter, and a movable stage, in which the first reflection attenuation filter and the second reflection attenuation filter are disposed such that polarization directions are orthogonal to each other, in which the space filter has an opening through which light emitted from a measurement target light emission point among the plurality of light emission points is transmitted, and in which the opening has a shape in which a dimension of the measurement target light emission point in a fast direction is larger than a dimension of the measurement target light emission point in a slow direction.

7 Claims, 9 Drawing Sheets

LIGHT SOURCE MEASUREMENT APPARATUS

BACKGROUND

1. Technical Field

The present disclosure relates to a light source measurement apparatus, and particularly to a measurement apparatus for a light source having a plurality of light emission points.

2. Description of the Related Art

In a direct diode laser (DDL) using a semiconductor laser (LD) as a direct light source, it is very important to accurately recognize beam characteristics in order to collect beams from respective LDs at a fiber. Beam characteristics of the LD include a size and a beam spread angle of each light emission point in a fast direction (fast axis) and a slow direction (slow axis). As a method of evaluating a size of a light emission point, there is near field pattern (NFP) measurement. As a method of evaluating a beam spread angle, there is far field pattern (FFP) measurement. A light source position adjustment apparatus disclosed in Japanese Patent No. 3594706 measures an NFP with a positional deviation measurement imaging element when a displacement amount from a predetermined reference position of a light emission point position is measured. The light source position adjustment apparatus disclosed in Japanese Patent No. 3594706 measures an FFP with an angular deviation measurement imaging element when an axis deviation angle of a light source in a light radiation direction is measured.

SUMMARY

According to the present disclosure, there is provided a light source measurement apparatus including an objective lens that collects light emitted from a light source having a plurality of light emission points; a first reflection attenuation filter that causes a part of light emitted from the objective lens to pass the first reflection attenuation filter; a second reflection attenuation filter that causes a part of light having passed through the first reflection attenuation filter to pass the second reflection attenuation filter; a condensing lens to which light having passed through the second reflection attenuation filter is incident; and a space filter that is disposed at a condensing position of light collected by the condensing lens, in which the first reflection attenuation filter and the second reflection attenuation filter are disposed such that polarization directions of the first reflection attenuation filter and the second reflection attenuation filter are orthogonal to each other, and in which the space filter has a slit that is longer in a direction matching the fast direction of a measurement target light emission point among the plurality of light emission points than in a direction matching the slow direction of the measurement target light emission point.

DETAILED DESCRIPTION

In recent years, a light source having a plurality of light emission points used in a light source such as a high power DDL for processing has been developed. The light source having a plurality of light emission points is, for example, an LD light source called an LD bar. A single light emission point is present in each general CAN type LD. In contrast, in the LD bar, a plurality of light emission points are disposed in a linear array form with high density.

Therefore, the present disclosure provides a light source measurement apparatus capable of measuring each light emission point for a light source having the plurality of light emission points.

Hereinafter, an exemplary embodiment of the present disclosure will be described with reference to the drawings.

Light Source Having Plural Light Emission Points

Figure 1A:
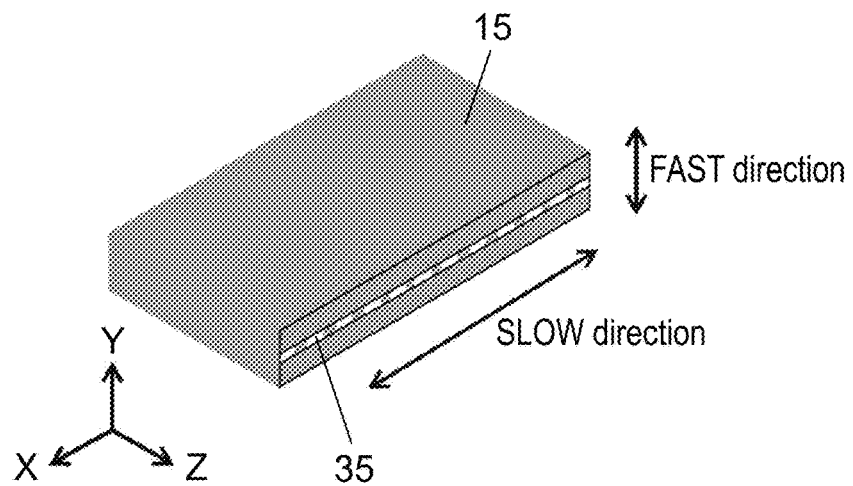
FIGS. 1A to 1C are schematic diagrams illustrating an LD bar in an exemplary embodiment.
Figure 1B:
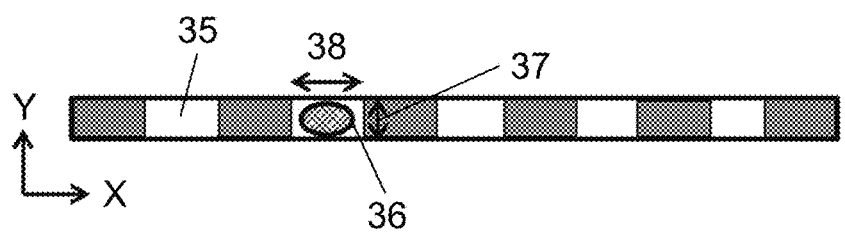
Figure 1C:
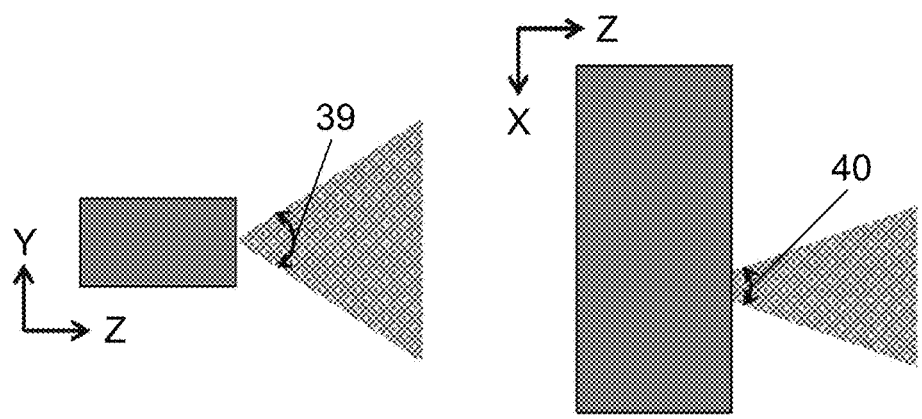

LD bar 15 is used as an example of a light source having a plurality of light emission points. FIGS. 1A to 1C are schematic diagrams illustrating LD bar 15.

FIG. 1A is a schematic perspective view illustrating LD bar 15. As illustrated in FIG. 1A, in LD bar 15, a plurality of light emitting elements 35 are arranged in a linear array form in a slow direction. Here, the slow direction represents an X axis direction in FIGS. 1A to 1C, and a fast direction represents a Y axis direction in FIGS. 1A to 1C.

FIG. 1B is an enlarged schematic diagram illustrating light emitting elements 35. As illustrated in FIG. 1B, light emission point 36 included in light emitting element 35 has fast-direction light emission point width 37 that is a width in the Y direction in FIGS. 1A to 1C, and slow-direction light emission point width 38 that is a width in the X direction in FIGS. 1A to 1C.

FIG. 1C is a schematic diagram illustrating a case where a beam is emitted from single light emission point 36. As illustrated in FIG. 1C, a beam radiated from light emission point 36 is diffused with fast-direction spread angle 39 and slow-direction spread angle 40.

Beam characteristics in each light emission point 36 and a positional deviation of each light emission point 36 called SMILE are measured. Here, the beam characteristics are, for example, a size or a beam spread angle of light emission point 36.

The beam characteristics in each light emission point 36 are measured, and thus it is possible to perform optical design suitable not only for entire LD bar 15 but also for each light emission point 36. Thus, it is possible to realize more accurate optical design. A positional deviation of the SMILE is measured, and thus it is possible to perform optical design in accordance with actual disposition of each light emission point 36 on LD bar 15 instead of ideal disposition of each light emission point 36. Thus, it is possible to realize more accurate optical design.

Beam Evaluation Apparatus

Figure 2:
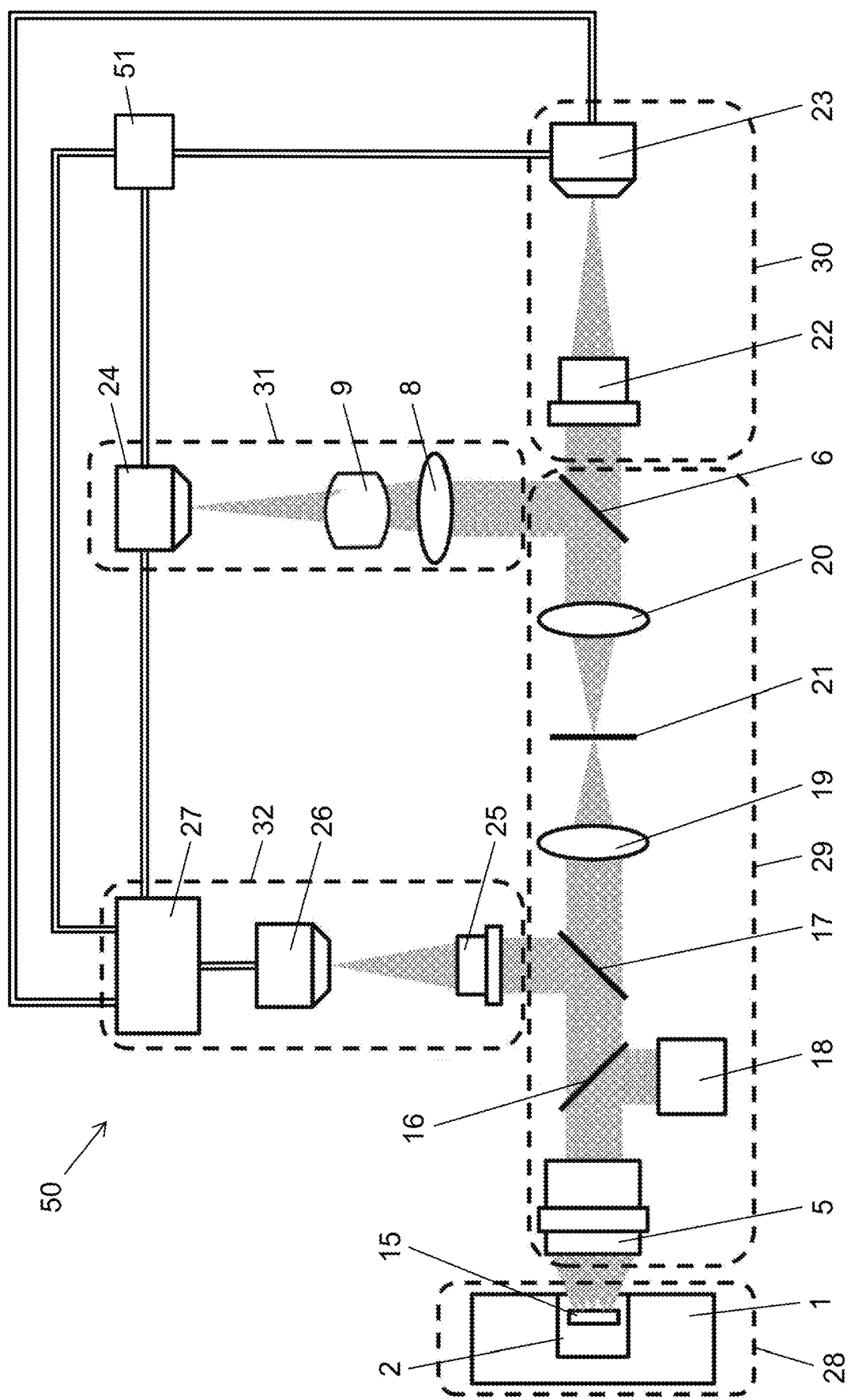
FIG. 2 is an exterior schematic diagram illustrating a beam evaluation apparatus in the exemplary embodiment.

FIG. 2 is an exterior schematic diagram illustrating beam evaluation apparatus (light source measurement apparatus) 50.

Beam evaluation apparatus 50 includes stage 28, power attenuation/light emission point selector 29, NFP measurer 30, FFP measurer 31, SMILE measurer 32, and display 51.

A description will be made of motion of a beam in stage 28. Stage 28 includes multi-axis stage device 1 and LD bar 15. Multi-axis stage device 1 is provided with movable stage 2 on which LD bar 15 is mounted. The stage 2 is movable in the X axis direction, the Y axis direction, and the Z axis direction through a worker's operation.

A beam is emitted from LD bar 15 mounted on stage 2 of multi-axis stage device 1. The beam is directed toward power attenuation/light emission point selector 29.

A description will be made of motion of the beam in power attenuation/light emission point selector 29. Power attenuation/light emission point selector 29 includes objective lens 5, half mirror (split optical system) 6, first reflection attenuation filter 16, second reflection attenuation filter 17, beam damper 18, first condensing lens 19, second condensing lens 20, and space filter 21.

First, the beam is converted into parallel light by objective lens 5 disposed at a position separated from a position of light emission point 36 of LD bar 15 by a focal length.

Thereafter, the beam passes through first reflection attenuation filter 16 and second reflection attenuation filter 17.

Reflected light reflected at first reflection attenuation filter 16 is absorbed by beam damper 18. The parallel light having passed through first reflection attenuation filter 16 is incident to second reflection attenuation filter 17.

Reflected light reflected at second reflection attenuation filter 17 is directed toward SMILE measurer 32. The parallel light having passed through second reflection attenuation filter 17 is collected by first condensing lens 19.

Space filter 21 having a shape which will be described later is disposed at a condensing position of first condensing lens 19.

A beam from single light emission point 36 is selected from among beams from respective light emission points 36, emitted from LD bar 15, by a slit of space filter 21. The selected beam passes through space filter 21, and then passes through second condensing lens 20 while diffusing so as to return to parallel light. Non-selected beams are blocked by space filter 21. Here, second condensing lens 20 is disposed to be separated from space filter 21 by a focal length of second condensing lens 20.

The beam converted into the parallel light is split into two beams by half mirror 6 having the same transmittance and reflectance, and one beam is directed toward NFP measurer 30, and the other beam is directed toward FFP measurer 31.

A description will be made of motion of the beam in NFP measurer 30. NFP measurer 30 includes image formation lens 22 and NFP imaging element 23.

The beam advancing to NFP measurer 30 forms an image in image formation lens 22. The image formed by the beam is acquired by NFP imaging element 23 disposed at an image formation position.

A description will be made of motion of beam in FFP measurer 31. FFP measurer 31 includes field lens 8, relay lens 9, and FFP imaging element 24.

The beam advancing to FFP measurer 31 passes through field lens 8 and relay lens 9. Thereafter, an image formed by the beam is acquired by FFP imaging element 24 disposed at an image formation position.

Calculator 27 is coupled to NFP imaging element 23 and FFP imaging element 24, and acquires formed images (NFP image and FFP image) from NFP imaging element 23 and FFP imaging element 24. Calculator 27 converts the FFP image acquired by FFP imaging element 24 from an XY coordinate system into an angular coordinate system. When a combined magnification of field lens 8 and relay lens 9 is indicated by M, conversion equations for the fast direction and the slow direction are represented as in Equations (1) and (2).

$$Y = M \times F1 \times \sin \theta y \quad (1)$$

$$X = M \times F1 \times \sin \theta x \quad (2)$$

Here, Y is a value on a Y axis of the XY coordinate system. X is a value on an X axis of the XY coordinate system. F1 is a focal length of objective lens 5. θy is a value on a θy axis of the angular coordinate system. θx is a value on a θx axis of the angular coordinate system. A description will be made of motion of a beam in SMILE measurer 32. SMILE measurer 32 includes image formation lens 25, SMILE measurement imaging element (light emission point measurer) 26, and calculator 27.

A beam advancing to SMILE measurer 32 forms an image in SMILE measurement image formation lens 25. The image (SMILE image) formed by the beam is acquired by SMILE measurement imaging element 26 disposed at an image formation position.

As will be described later, calculator 27 corrects the acquired SMILE image.

Display 51 is coupled to NFP imaging element 23, FFP imaging element 24, and calculator 27. Display 51 outputs the NFP image and FFP image respectively acquired by NFP imaging element 23 and FFP imaging element 24. Display 51 outputs the SMILE image acquired and corrected by calculator 27. Beam evaluation apparatus 50 may include a plurality of displays 51. For example, a first display may display an NFP image, a second display may display an FFP image, and a third display may display a SMILE image.

Reflection Attenuation Filters

Figure 3:
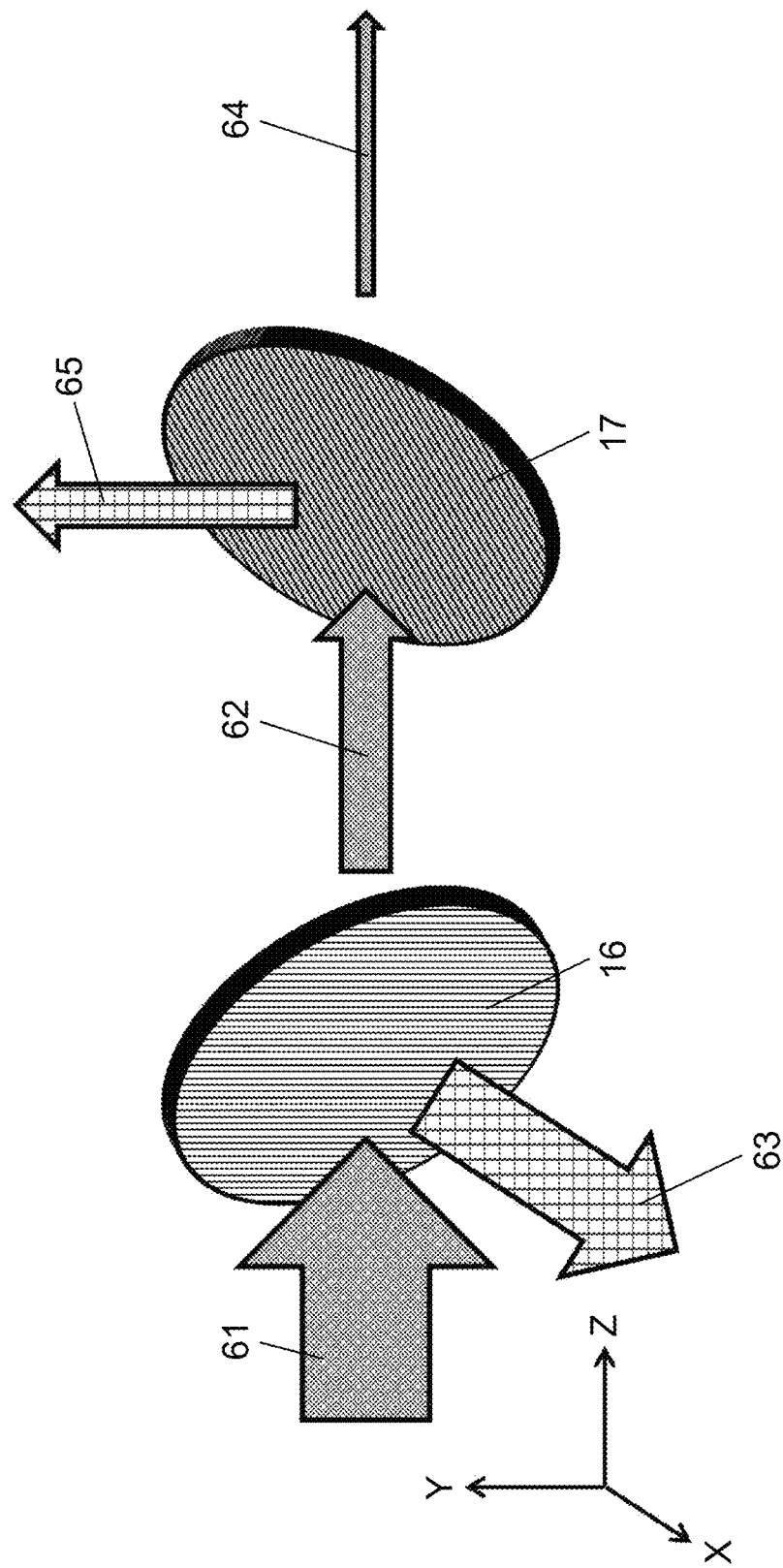
FIG. 3 is a schematic diagram illustrating disposition of a first reflection attenuation filter and a second reflection attenuation filter in the exemplary embodiment.

FIG. 3 is a schematic diagram illustrating disposition of first reflection attenuation filter 16 and second reflection attenuation filter 17.

LD bar 15 has high power, and is thus required to have light reducing means in order to measure beam characteristics in each light emission point 36. However, in a case where an absorption light reducing filter is used, the filter absorbs most of energy, and thus there is danger of heat damage. In a case of a reflection light reducing filter, heat damage can be reduced, but reflectance differs due to polarization of a light source, and thus beam characteristics change before and after a beam is transmitted through the reflection light reducing filter such that beam characteristics cannot be accurately measured.

Therefore, beam evaluation apparatus 50 of the present exemplary embodiment attenuates power of a beam by using two reflection attenuation filters.

First reflection attenuation filter 16 and second reflection attenuation filter 17 are disposed such that polarization directions are orthogonal to each other.

In FIG. 3, beam 61 is incident into first reflection attenuation filter 16, and is then split into beam 62 transmitted through first reflection attenuation filter 16 and beam 63 reflected at first reflection attenuation filter 16. Beam 62 incident to second reflection attenuation filter 17 is split into beam 64 transmitted through second reflection attenuation filter 17 and beam 65 reflected at second reflection attenuation filter 17. In a case where an advancing direction of beam 61 is assumed to be the Z direction, first reflection attenuation filter 16 is disposed such that reflected light (beam 63) advances in the X direction, and transmitted light (beam 62) advances in the Z direction. On the other hand, second reflection attenuation filter 17 is disposed such that reflected light (beam 65) advances in the Y direction, and transmitted light (beam 64) advances in the Z direction. In other words, the two reflection attenuation filters are disposed such that, among three axes such as the X axis, the Y axis, and the Z axis, one axis matching the advancing direction of beam 61 is an axis matching the advancing direction of transmitted light (beam 62 and beam 64). One reflection attenuation filter is disposed such that one of the two axes not matching the advancing direction of beam 61 is an axis matching the advancing direction of reflected light (beam 63 and beam 65), and the other reflection attenuation filter is disposed such that the other of the two axes not matching the advancing direction of beam is an axis matching the advancing direction of the reflected light.

As illustrated in FIG. 3, first reflection attenuation filter 16 and second reflection attenuation filter 17 are disposed, and thus it is possible to mutually cancel out influences of reflectances that are different from each other according to polarization components. Therefore, it is possible to attenuate beam power without changing beam polarization characteristics.

Space Filter

Figure 4:
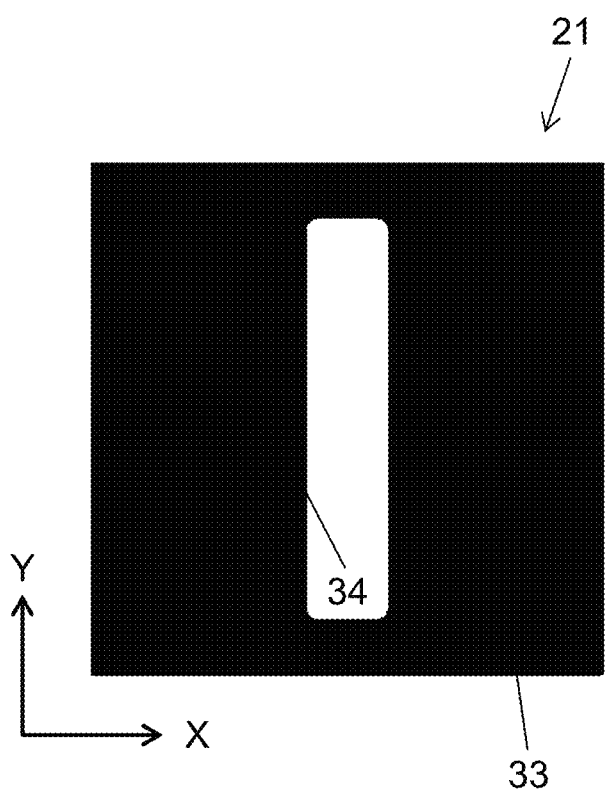
FIG. 4 is a schematic diagram illustrating a space filter in the exemplary embodiment.

FIG. 4 is a schematic diagram illustrating space filter 21.

Since light emission points 36 are close to each other, it is necessary to extract only light from single light emission point 36 in order to measure an NFP and an FFP in each light emission point 36 of LD bar 15.

Therefore, in beam evaluation apparatus 50 according to the present exemplary embodiment, light from single light emission point 36 is extracted by using space filter 21.

Space filter 21 has light blocker 33 and pass (opening) 34. Pass 34 is also referred to as a slit. A shape of pass 34 of general space filter 21 is a circular shape, but is not appropriate this time. This is because element sizes and spread angles of light emission points 36 of LD bar 15 are different from each other depending on the fast direction and the slow direction. Slow-direction light emission point width 38 is larger than fast-direction light emission point width 37. Thus, an NFP image at a condensing position has an elongated shape in the slow direction. On the other hand, fast-direction spread angle 39 is larger than slow-direction spread angle 40, and an FFP image at a condensing position is elongated in the fast direction.

Therefore, pass 34 of space filter 21 is longer in a direction matching the fast direction of light emission point 36 than in a direction matching the slow direction of light emission point 36.

More specifically, in a case where a dimension of light emitting element 35 of light emission point 36 that is a measurement target in the fast direction is indicated by Lf, a dimension thereof in the slow direction is indicated by Ls, a focal length of objective lens 5 is indicated by F1, and a focal length of condensing lens 19 is indicated by F2, fast-direction dimension Of of pass 34 of space filter 21 may be expressed as in the following Equation (3) or (4), and a value of Of may be defined in a range of ±10% of a greater value of Ofa and Ofb.

$$Ofa = (1.3 \times Lf \times F2)/F1 \quad (3)$$

$$Ofb = 0.2 \times F1 \quad (4)$$

Slow-direction dimension Os may be expressed as in the following Equation (5) or (6), and a value of Os may be defined in a range of ±10% of a greater value of Osa or Osb.

$$Osa = (1.3 \times Ls \times F2)/F1 \quad (5)$$

$$Osb = F1 \quad (6)$$

Pass 34 has a rectangular shape in FIG. 4 for simplification, but may have an elliptical shape or a polygonal shape. In other words, a shape may be used in which the fast-direction dimension of the opening portion of pass 34 is larger than the slow-direction dimension.

Here, a relationship between the focal lengths of objective lens 5 and condensing lens 19 is expressed by the following Expression (7).

$$F1 > F2 \quad (7)$$

In other words, objective lens 5 has a greater magnification than a magnification of condensing lens 19.

Objective lens 5 and condensing lens 19 having such focal length relationship are different from each other in magnification relationship. Thus, beams emitted from the plurality of light emission points 36 of LD bar 15 are spatially separated from each other, and are then collected at the condensing position. Therefore, space filter 21 can cause a beam from any one light emission point 36 to pass therethrough, and can thus block beams from the other light emission points 36.

NFP Measurement

Figure 5:
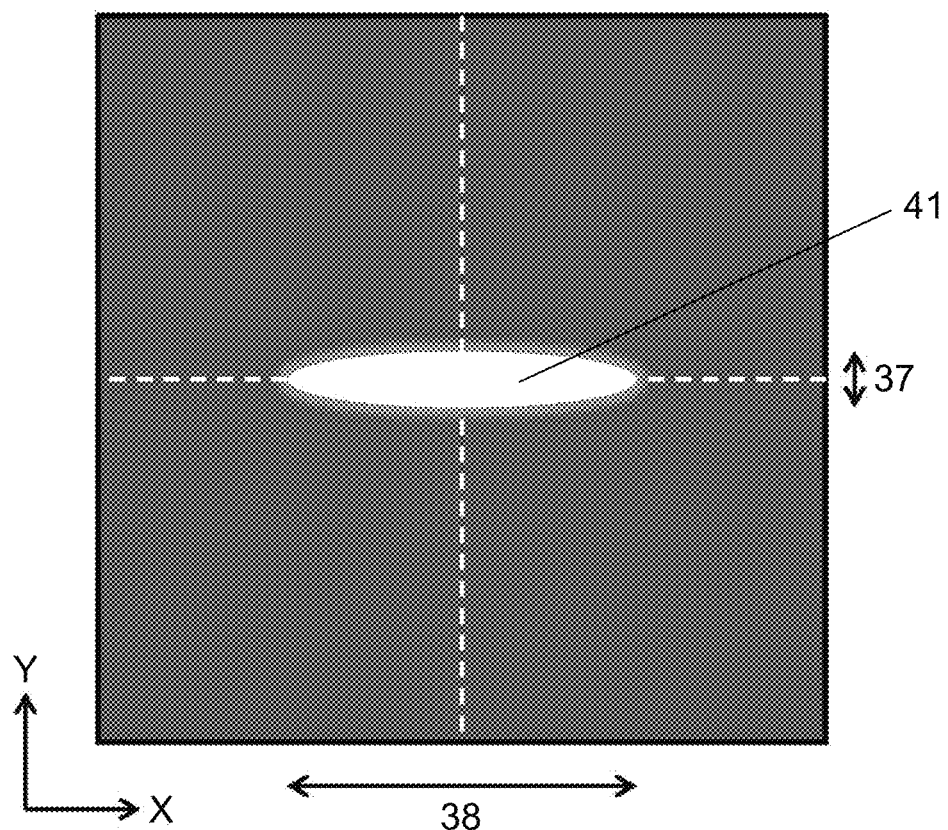
FIG. 5 is a schematic diagram illustrating an NFP measurement image in the exemplary embodiment.

FIG. 5 is a schematic diagram illustrating an NFP image acquired by NFP imaging element 23.

In the NFP image, NFP light emission point image 41 for single light emission point 36 is obtained. Slow-direction light emission point width 38 is displayed on the X axis, and fast-direction light emission point width 37 are displayed on the Y axis, as widths of NFP light emission point image 41.

FFP Measurement

Figure 6:
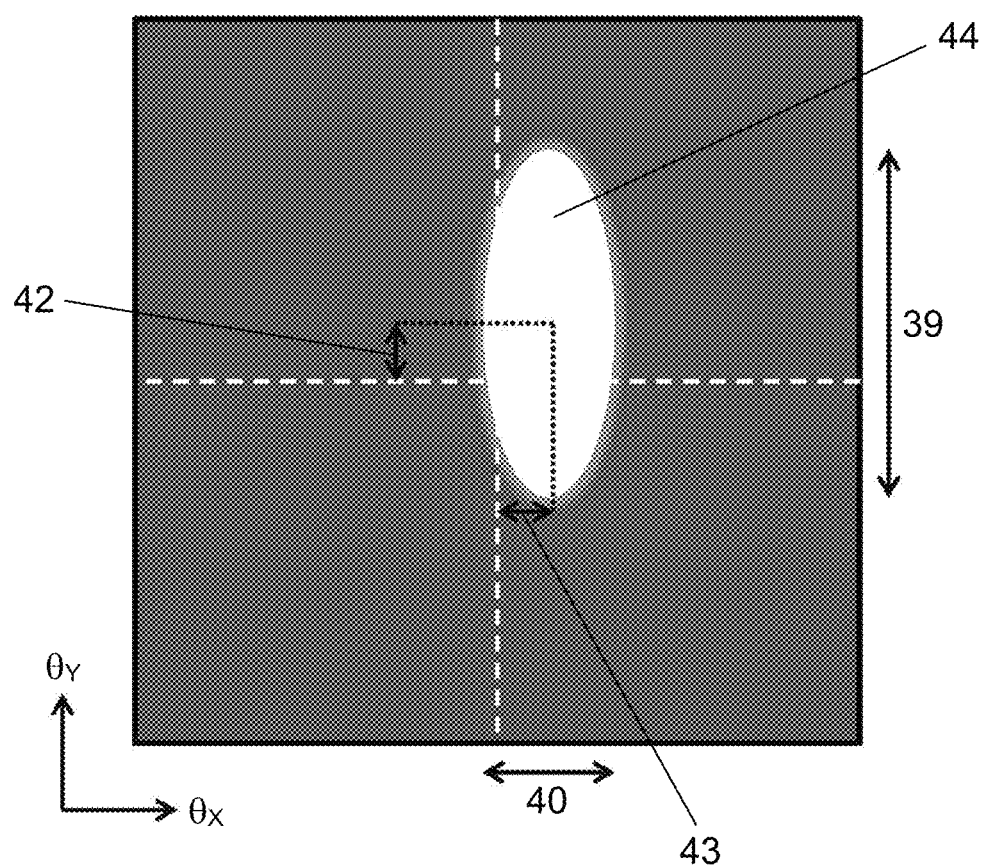
FIG. 6 is a schematic diagram illustrating an FFP measurement image in the exemplary embodiment.

FIG. 6 is a schematic diagram illustrating an FFP image converted into the angular coordinate system by calculator 27.

In the FFP image, FFP light emission point image 44 for single light emission point 36 is obtained. Slow-direction spread angle 40 is displayed on the θx axis, and fast-direction spread angle 39 is displayed on the θy axis, as widths of FFP light emission point image 44.

The center of an image is located in a direction perpendicular to both of the fast direction and the slow direction with respect to objective lens 5, and is thus used as a reference direction of light emission point 36. A difference between a central position of the FFP image and an image central position indicates an irradiation angle deviation of light emission point 36 for the reference direction. In other words, a difference on the θx axis indicates slow-direction angular deviation 43, and a difference on the θy axis indicates fast-direction angular deviation 42.

SMILE Measurement

Figure 7:
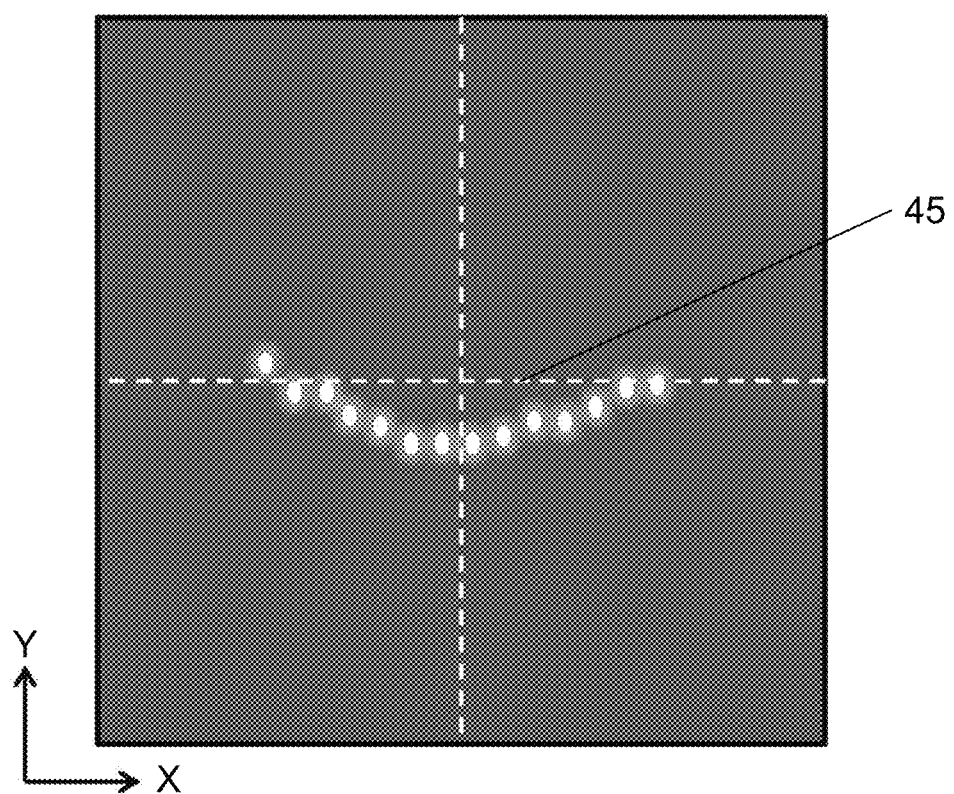
FIG. 7 is a schematic diagram illustrating a SMILE measurement image in the exemplary embodiment.

FIG. 7 is a schematic diagram illustrating a SMILE measurement image.

An image obtained by forming light emission images of the whole LD bar 15 is a SMILE measurement image. Each light emission image group of light emission point 36 indicating a position of each light emission point 36 is referred to as a SMILE image. In a case where both of LD bar 15 and each light emission point 36 are in an ideal state, respective light emission point images are disposed to be linearly arranged. However, for example, in a case where there is a positional error of each light emission point 36 during manufacturing of LD bar 15 or LD bar 15 is bent, respective light emission points 36 are disposed to be deviated from a straight line instead of a straight line. Thus, the degree of actual deviation of each light emission point 36 differs even between LD bars 15 of the same model. Consequently, an actual deviation of each light emission point 36 is recognized by obtaining a SMILE image.

FIG. 7 is a schematic diagram illustrating SMILE image 45 before being corrected, acquired by SMILE measurement imaging element 26. In addition to a positional deviation of light emission point 36, an irradiation angular deviation of light emission point 36 may be reflected in SMILE image 45 before being corrected. Therefore, only information regarding a positional deviation of light emission point 36 may not be obtained.

Therefore, calculator 27 corrects obtained SMILE image 45 before being corrected. Specifically, a positional deviation due to an irradiation angular deviation of each light emission point 36 is corrected on the basis of numerical values of slow-direction angular deviation 43 and fast-direction angular deviation 42 of each light emission point 36, obtained by FFP measurer 31.

A focal length of image formation lens 25 is indicated by F3, slow-direction angular deviation 43 in single light emission point 36 is indicated by $\Delta\theta_x$, and fast-direction angular deviation 42 therein is indicated by $\Delta\theta_y$. In SMILE image 45 before being corrected, positional deviation amounts in the X axis direction ($\Delta_X$) and in the Y axis direction ($\Delta_Y$) due to an irradiation angular deviation in single light emission point 36 are respectively represented by the following Equations (8) and (9).

$$\Delta_X = F2/F1 \times \sin \Delta\theta_x \quad (8)$$

$$\Delta_Y = F2/F1 \times \sin \Delta\theta_y \quad (9)$$

Calculator 27 performs the calculation process on all light emission points 36 included in SMILE image 45 before being corrected. As a result, a positional deviation amount due to an irradiation angular deviation in each light emission point 36 is calculated.

Next, calculator 27 performs an image processing for moving a coordinate of light emission point 36 in SMILE image 45 before being corrected such that a calculated irradiation angular deviation is corrected for one light emission point 36 in SMILE image 45 before being corrected.

Figure 8:
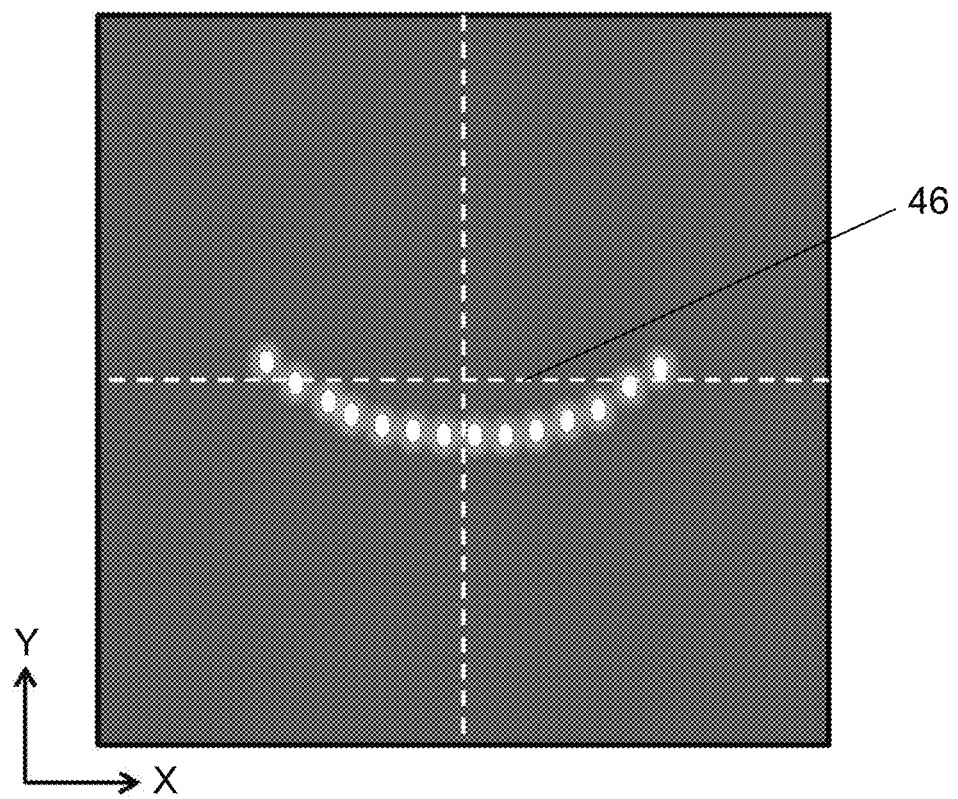
FIG. 8 is a schematic diagram illustrating a SMILE image after being corrected in the exemplary embodiment.

Calculator 27 performs the image processing on all of light emission points 36 included in SMILE image 45 before being corrected. Thus, SMILE image 46 after being corrected is output as illustrated in FIG. 8.

Measurement Flow

Figure 9:
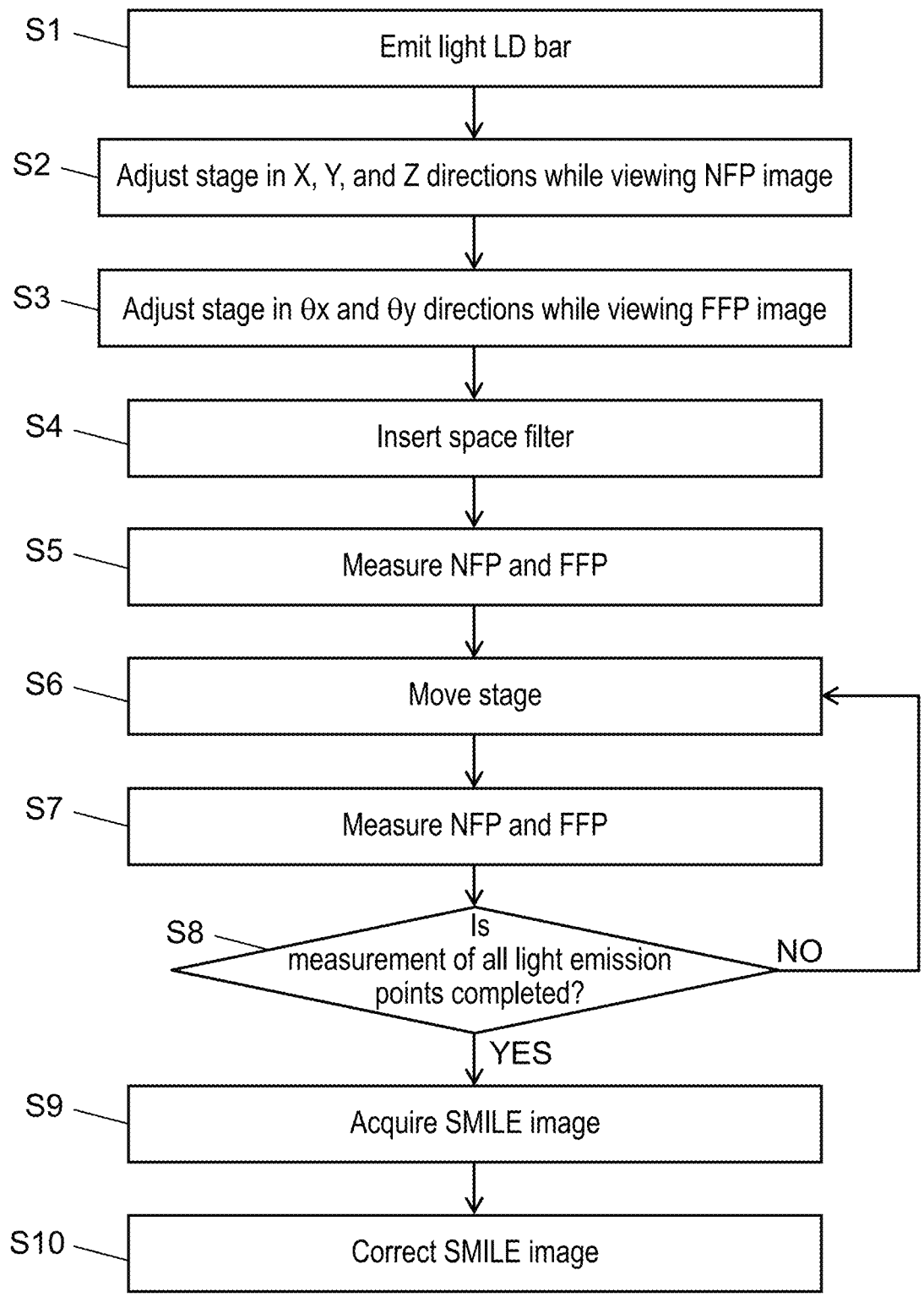
FIG. 9 is a measurement flowchart in the exemplary embodiment.

With reference to FIGS. 9 and 2, a measurement flow of the present disclosure will be described. FIG. 9 is a measurement flowchart according to Exemplary embodiment 1.

First, a worker operates beam evaluation apparatus 50 to cause LD bar 15 to emit light (S1). Next, the worker operates multi-axis stage device 1 while viewing an NFP image displayed on display 51, and adjusts stage 2 in the X axis direction, the Y axis direction, and the Z axis direction (S2). In step S2, the worker adjusts stage 2 such that a light emission image of light emission point 36 used as a reference is moved to the center of a screen.

Thereafter, the worker adjusts stage 2 in the θx direction and the θy direction while checking an FFP image displayed on display 51 (S3). In step S3, the worker adjusts stage 2 such that a light emission image of light emission point 36 used as a reference is moved to the center of the screen.

The worker adjusts a position of stage 2, and then inserts space filter 21 into a condensing position of condensing lens 19 (S4). The worker confirms that light emission images of other light emission points except measured light emission point 36 are reflected in the NFP image and the FFP image in this state. The worker operates beam evaluation apparatus 50 to start NFP measurement and FFP measurement (S5). Beam evaluation apparatus 50 having received a measurement starting instruction measures a light emission point width and a spread angle in each of the fast direction and the slow direction. Specifically, NFP imaging element 23 acquires an image formed by a beam applied from measurement target light emission point 36, and generates an NFP image. Calculator 27 acquires the NFP image from NFP imaging element 23, and specifies light emission point widths of measurement target light emission point 36 in the fast direction and the slow direction on the basis of the acquired NFP image. FFP imaging element 24 acquires an image formed by a beam applied from measurement target light emission point 36, and generates an FFP image. Calculator 27 acquires the FFP image from FFP imaging element 24, and converts the acquired FFP image into an angular coordinate system. Calculator 27 specifies spread angles of measurement target light emission point 36 in the fast direction and the slow direction on the basis of the FFP image converted into the angular coordinate system.

After measurement of light emission point 36 used as a reference is finished, the worker moves stage 2 such that only a beam applied from another light emission point 36 can be measured (S6). Specifically, in step S6, first, the worker moves stage 2 in the X axis direction by a designed light emission point interval. The worker adjusts stage 2 in the X axis direction, the Y axis direction, and the Z axis direction such that another light emission point image is moved to the center of NFP the screen. The worker adjusts the position of the stage, and then starts NFP measurement and FFP measurement of measurement target light emission point 36 (S7). Specifically, NFP imaging element 23 acquires an image formed by a beam applied from measurement target light emission point 36, and generates an NFP image. Calculator 27 acquires the NFP image from NFP imaging element 23, and specifies light emission point widths of measurement target light emission point 36 in the fast direction and the slow direction on the basis of the acquired NFP image. FFP imaging element 24 acquires an image formed by a beam applied from measurement target light emission point 36, and generates an FFP image. Calculator 27 acquires the FFP image from FFP imaging element 24, and converts the acquired FFP image into an angular coordinate system. Calculator 27 specifies spread angles of measurement target light emission point 36 in the fast direction and the slow direction on the basis of the FFP image converted into the angular coordinate system. Calculator 27 specifies angular deviation amounts in the fast direction and the slow direction on the basis of the FFP image converted into the angular coordinate system.

The worker repeatedly performs steps S6 and S7 until NFP measurement and FFP measurement of all of light emission points 36 are completed (S8).

After measurement of all of light emission points 36 is completed (YES in S8), the worker operates beam evaluation apparatus 50 to start acquisition of a SMILE image (S9). Specifically, the worker adjusts stage 2 in the X axis direction such that all of light emission points 36 are imaged by SMILE measurement imaging element 26. After the stage is adjusted, the worker operates beam evaluation apparatus

50 to acquire a SMILE image. SMILE measurement imaging element 26 having received the operation acquires a SMILE image.

Calculator 27 acquires the SMILE image from SMILE measurement imaging element 26. Calculator 27 computes a positional deviation of each light emission point in the SMILE image on the basis of an irradiation angular deviation of each light emission point 36 measured in step S7. Calculator 27 corrects the SMILE image by an angular deviation on the basis of a computation result (S10).

The present disclosure is useful for a light source that has a plurality of light emission points and in which the plurality of light emission points are disposed at a short interval of below 1 mm.

Advantageous Effects of Exemplary Embodiments

Hereinafter, advantageous effects of the light source measurement apparatus will be described.

A light source measurement apparatus according to the present exemplary embodiment includes an objective lens that collects light emitted from a light source having a plurality of light emission points; a first reflection attenuation filter that causes light emitted from the objective lens to pass therethrough and reflects the light; a second reflection attenuation filter that causes light transmitted through the first reflection attenuation filter to pass therethrough and reflects the light; a condensing lens that collects light transmitted through the second reflection attenuation filter; a space filter that is disposed at a condensing position of the light collected by the condensing lens; and a movable stage on which the light source is mounted, in which the first reflection attenuation filter and the second reflection attenuation filter are disposed such that polarization directions are orthogonal to each other, in which the space filter has an opening through which light emitted from a measurement target light emission point among the plurality of light emission points is transmitted, and in which the opening has a shape in which a dimension of the measurement target light emission point in a fast direction is larger than a dimension of the measurement target light emission point in a slow direction.

The light source measurement apparatus can attenuate energy while reducing the influence on beam characteristics by using the two reflection attenuation filters and can select one light emission point from among the plurality of light emission points by using the space filter, with respect to the light source having the plurality of light emission points.

Therefore, with reference to the light source having the plurality of light emission points, each light emission point can be measured.

An advancing direction of transmitted light that is transmitted through the first reflection attenuation filter matches an advancing direction of light emitted from the objective lens; an advancing direction of reflected light that is reflected at the first reflection attenuation filter is orthogonal to the advancing direction of the light emitted from the objective lens; an advancing direction of transmitted light that is transmitted through the second reflection attenuation filter matches the advancing direction of the light emitted from the objective lens; and an advancing direction of reflected light that is reflected at the second reflection attenuation filter is orthogonal to the advancing direction of the light emitted from the objective lens, and is orthogonal to the advancing direction of the reflected light reflected at the first reflection attenuation filter.

The two reflection attenuation filters disposed in the above-described way can reduce the influence on beam characteristics before and after transmission.

Therefore, it is possible to measure a light emission point with higher accuracy.

The magnification of the objective lens is larger than that of the condensing lens.

Consequently, beams emitted from the plurality of light emission points are spatially separated from each other, and are then collected at the condensing position of the objective lens.

Therefore, it is possible to cause a beam from one light emission point among the plurality of light emission points to pass through the space filter and thus to block beams from the other light emission points.

In a case where a dimension of a light emitting element of the measurement target light emission point in the fast direction is indicated by $Lf$, a focal length of objective lens is indicated by $F1$, and a focal length of the condensing lens is indicated by $F2$, fast-direction dimension $Of$ of the opening of the space filter is defined in a range of $\pm 10\%$ of a greater value of $((1.3 \times Lf \times F2)/F1)$ and $(0.2 \times F1)$.

The space filter enables a beam from one light emission point among a plurality of light emission points to easily pass through a slit.

In a case where a dimension of the light emitting element of the measurement target light emission point in the slow direction is indicated by $Ls$, slow-direction dimension $Os$ of the opening of the space filter is defined in a range of $\pm 10\%$ of a greater value of $((1.3 \times Ls \times F2)/F1)$ and $F1$.

The space filter enables a beam from one light emission point among a plurality of light emission points to easily pass through the slit.

The light source measurement apparatus further includes a split optical system that splits light having passed through the opening into light beams; an NFP measurer that measures an NFP of the measurement target light emission point on the basis of an image of one of the light beams split by the split optical system; and an FFP measurer that measures an FFP of the measurement target light emission point on the basis of an image of the other of the light beams split by the split optical system.

The light source measurement apparatus can measure beam characteristics of each light emission point with respect to the light source having the plurality of light emission points.

The light source measurement apparatus further includes a light emission point measurer that captures an image including all of the plurality of light emission points; and a calculator, in which the calculator calculates a deviation amount of an irradiation angle of the measurement target light emission point on the basis of an image acquired by the FFP measurer, and performs image processing on the image captured by the light emission point measurer such that the deviation amount is corrected.

The light source measurement apparatus can measure a positional deviation of each light emission point. As described above, light source measurement apparatus 50 according to the present disclosure can measure each light emission point 36 with respect to a light source having a plurality of light emission points 36.

According to the beam evaluation apparatus and the beam evaluation method of the present disclosure, since an NFP and an FFP as beam characteristics of an LD bar can be measured for each light emission point, and SMILE can also be measured, an optical system suitable for the beam characteristics is designed on the basis of measurement results, and thus it is possible to realize development of a high-performance DDL.

What is claimed is:

1. A light source measurement apparatus comprising:
   an objective lens that collects light emitted from a light source having a plurality of light emission points;
   a first reflection attenuation filter that (i) causes a part of light emitted from the objective lens to pass through the first reflection attenuation filter and (ii) reflects another parts of the light emitted from the objective lens;
   a second reflection attenuation filter that (i) causes the part of light having passed through the first reflection attenuation filter to pass through the second reflection attenuation filter and (ii) reflects another part of the light having passed through the first reflection attenuation filter;
   a condensing lens that collects light having passed through the second reflection attenuation filter;
   a space filter disposed at a condensing position of the light collected by the condensing lens; and
   a movable stage on which the light source is mounted,
   wherein the first reflection attenuation filter and the second reflection attenuation filter are arranged such that polarization directions of the first reflection attenuation filter and the second reflection attenuation filter are orthogonal to each other,
   wherein the space filter has an opening through which passes light emitted from a measurement target light emission point, the measurement target light emission point being one of the plurality of light emission points, and
   wherein a dimension of the opening in a fast direction of the measurement target light emission point is larger than a dimension of the opening in a slow direction of the measurement target light emission point.

2. The light source measurement apparatus of claim 1,
   wherein an advancing direction of the light having passed through the first reflection attenuation filter matches an advancing direction of the light emitted from the objective lens, and an advancing direction of reflected light reflected at the first reflection attenuation filter is orthogonal to the advancing direction of the light emitted from the objective lens, and
   wherein an advancing direction of the light having passed through the second reflection attenuation filter matches the advancing direction of the light emitted from the objective lens, and an advancing direction of reflected light reflected at the second reflection attenuation filter is orthogonal to the advancing direction of the light emitted from the objective lens, and is orthogonal to the advancing direction of the reflected light reflected at the first reflection attenuation filter.

3. The light source measurement apparatus of claim 1,
   wherein a magnification of the objective lens is larger than a magnification of the condensing lens.

4. The light source measurement apparatus of claim 1,
   wherein, in a case where a dimension of a light emitting element of the measurement target light emission point in the fast direction is indicated by Lf, a focal length of the objective lens is indicated by F1, and a focal length of the condensing lens is indicated by F2, a fast-direction dimension Of of the opening is defined in a range of ±10% of a greater value of $(1.3 \times Lf \times F2)/F1$ and $0.2 \times F1$.

5. The light source measurement apparatus of claim 4,
   wherein, in a case where a dimension of the light emitting element in the slow direction is indicated by Ls, a slow-direction dimension Os of the opening is defined in a range of ±10% of a greater value of $(1.3 \times Ls \times F2)/F1$ and F1.

6. The light source measurement apparatus of claim 1, further comprising:
   a split optical system that splits light having passed through the opening into light beams;
   an NFP measurer that measures an NFP of the measurement target light emission point on the basis of an image of one of the light beams split by the split optical system; and
   an FFP measurer that measures an FFP of the measurement target light emission point on the basis of an image of the other of the light beams split by the split optical system.

7. The light source measurement apparatus of claim 6, further comprising:
   a light emission point measurer that captures an image including all of the plurality of light emission points; and
   a calculator,
   wherein the calculator calculates a deviation amount of an irradiation angle of the measurement target light emission point on the basis of an image acquired by the FFP measurer, and performs image processing on the image captured by the light emission point measurer such that the deviation amount is corrected.

* * * * *